(12) United States Patent
Ishii et al.

(10) Patent No.: US 9,564,544 B2
(45) Date of Patent: Feb. 7, 2017

(54) SOLAR CELL MODULE PRODUCTION METHOD

(71) Applicant: Panasonic Intellectual Property Management Co., Ltd., Osaka-shi, Osaka (JP)

(72) Inventors: Yosuke Ishii, Osaka (JP); Yuki Oikawa, Kyoto (JP); Satoshi Suzuki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 14/790,150

(22) Filed: Jul. 2, 2015

(65) Prior Publication Data
US 2015/0303337 A1   Oct. 22, 2015

Related U.S. Application Data

(63) Continuation of application No. PCT/JP2014/000008, filed on Jan. 6, 2014.

(30) Foreign Application Priority Data

Jan. 10, 2013   (JP) ................................. 2013-003003

(51) Int. Cl.
*H01L 21/00*   (2006.01)
*H01L 31/048*   (2014.01)
(Continued)

(52) U.S. Cl.
CPC ............ *H01L 31/048* (2013.01); *H01L 31/18* (2013.01); *B60K 2016/003* (2013.01); *Y02E 10/50* (2013.01)

(58) Field of Classification Search
None
See application file for complete search history.

(56) References Cited

U.S. PATENT DOCUMENTS

2010/0175819 A1   7/2010   Ryu
2015/0303337 A1*   10/2015   Ishii ..................... H01L 31/048
                                                                  438/67

FOREIGN PATENT DOCUMENTS

JP   60260164 A   12/1985
JP   01196181 A   8/1989
(Continued)

OTHER PUBLICATIONS

International Preliminary Report on Patentability corresponding to Application No. PCT/JP2014/000008; Date of Mailing: Jul. 14, 2015, with English translation.
(Continued)

*Primary Examiner* — Jack Chen
(74) *Attorney, Agent, or Firm* — Cantor Colburn LLP

(57) ABSTRACT

A solar cell production method, whereby: a plurality of solar cell strings connecting a prescribed number of solar cells in series are formed; a plurality of solar cell strings are lined up along a second direction intersecting a first direction in which the solar cell strings extend, and the same are arranged such that the interval at one end of the first direction between adjacent solar cell strings is smaller than the interval at the other end; the arranged plurality of solar cell strings are connected to each other and a solar cell connection body is formed; a first filling material sheet, the solar cell connection body, a second filling material sheet, and a second protective member are laminated upon a first protective member having a curved surface; pressure is applied from above the second protective member; and a solar cell module having a curved surface shape is formed.

6 Claims, 4 Drawing Sheets

(51) Int. Cl.
*H01L 31/18* (2006.01)
*B60K 16/00* (2006.01)

(56) References Cited

FOREIGN PATENT DOCUMENTS

| | | | |
|---|---|---|---|
| JP | 2002231990 | A | 8/2002 |
| JP | 2008244176 | A | 10/2008 |
| JP | 2010503227 | A | 1/2010 |
| JP | 2011151334 | A | 8/2011 |

OTHER PUBLICATIONS

Notification Concerning Transmittal of International Preliminary Report on Patentability and Notification of Transmittal of its translation corresponding to Application No. PCT/JP2014/000008; Date of Mailing: Jul. 23, 2015.
Second and Supplementary Notice Informing the Applicant of the Communication of the International Application corresponding to Application No. PCT/JP2014/000008; Date of Mailing: May 14, 2015.
Written Opinion of the International Searching Authority corresponding to Application No. PCT/JP2014/000008; Date of Mailing: Jan. 28, 2014.
International Search Report corresponding to Application No. PCT/JP2014/000008; Date of Mailing: Jan. 28, 2014, with English translation.

* cited by examiner

SECOND DIRECTION

SOLAR CELL MODULE PRODUCTION METHOD

CROSS REFERENCE TO RELATED APPLICATIONS

This application is a continuation under 35 U.S.C. §120 of PCT/JP2014/000008, filed Jan. 6, 2014, which is incorporated herein reference and which claimed priority under 35 U.S.C. §119 to Japanese Application No. 2013-003003, filed Jan. 10, 2013, the entire content of which is also incorporated herein by reference.

TECHNICAL FIELD

The present invention relates to a solar cell module production method, and more particularly to a method for producing a solar cell module having a curved surface.

BACKGROUND ART

As a solar cell module to be installed on a piece of land or a building, such a module having a planar outer shape is used. However, when a solar cell module is to be installed on a vehicle or the like, it is desired that the module have a curved surface conforming to the three-dimensional shape of the body of the vehicle.

For example, Patent Document 1 describes that a solar cell module to be mounted on an automobile or the like is configured to have a curved surface structure corresponding to the shape of the vehicle roof.

PRIOR ART LITERATURE

Patent Documents

Patent Document 1: JP H01-196181 A

SUMMARY OF THE INVENTION

Problems to be Solved by the Invention

In a method for producing a solar cell module having a curved surface, it is desired to suppress cracking of the solar cell module.

Means for Solving the Problems

A solar cell module production method according to the present invention comprises: forming a plurality of solar cell strings in each of which a predetermined number of solar cells are connected in series; arranging the plurality of solar cell strings along a second direction intersecting a first direction in which the solar cell strings extend, and also arranging the solar cell strings such that an interval between adjacent (N−1)th and Nth solar cell strings at one end in the first direction is smaller than an interval at the other end; connecting the arranged plurality of solar cell strings to each other to thereby form a connected solar cell unit; laminating a first filler sheet, the connected solar cell unit, a second filler sheet, and a second protective member, in that order, on a first protective member having a three-dimensional curved surface; and applying pressure from above the second protective member and thereby forming a solar cell module having a curved surface shape.

Advantages of the Invention

According to the present invention, in a method for producing a solar cell module having a curved surface, cracking of the solar cell module can be suppressed.

EMBODIMENTS OF THE INVENTION

Figure 1:
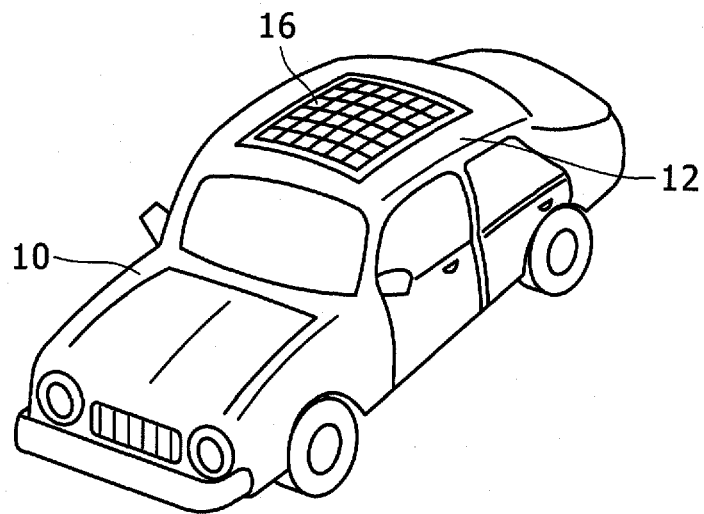
FIG. 1 is a diagram showing a vehicle mounted with a solar cell module produced by a solar cell module production method according to an embodiment of the present invention.

An embodiment of the present invention is described below in detail with reference to the drawings. In the following, identical or corresponding elements found throughout the drawings are labeled with the same reference numerals, and redundant descriptions are omitted.

Figure 2:
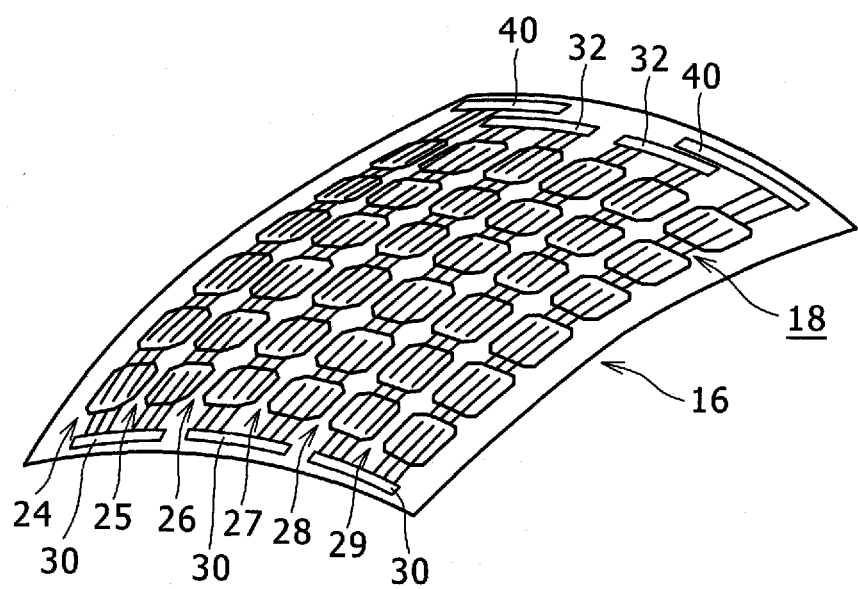
FIG. 2 is a perspective view of the solar cell module produced according to the embodiment of the present invention.
Figure 3:
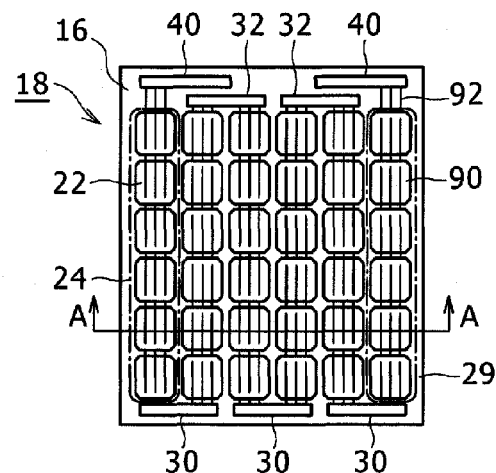
FIG. 3 is a top view of the solar cell module produced according to the embodiment of the present invention.

FIG. 1 is a diagram showing a solar cell module 16 embedded in a concave portion provided on a roof part of a vehicle body 12 of a vehicle 10. FIG. 2 is a perspective view of the solar cell module 16. FIG. 3 is a top view of the solar cell module 16.

As shown in FIG. 3, the solar cell module 16 includes a connected solar cell unit 18. The connected solar cell unit 18 is constituted by sequentially arranging a plurality of solar cell strings 24~29 along a direction intersecting a first direction which is the direction in which each of the solar cell strings 24~29 extends, and by electrically connecting the solar cell strings 24~29 to each other.

Connection members 30, 32 are conductors for connecting the six solar cell strings 24~29 in series. Output members 40 are wiring lines for outputting generated electric power to the outside.

More specifically, the connection members 30 connect between first ends of the adjacent solar cell strings 24 and 25, 26 and 27, and 28 and 29, respectively. The connection members 32 connect between the other ends of the adjacent solar cell strings 25 and 26, and 27 and 28, respectively. In other words, the solar cell strings 24~29 are connected in series by the connection members 30, 32.

The output members 40 are connected to first ends of the solar cell strings 24, 29 which are located at the two edges of the connected solar cell unit 18. The connected solar cell unit 18 is configured in this way.

The solar cell strings 24~29 are each configured by arranging and connecting a plurality of solar cells 22 in an array extending along a first direction.

Figure 4:
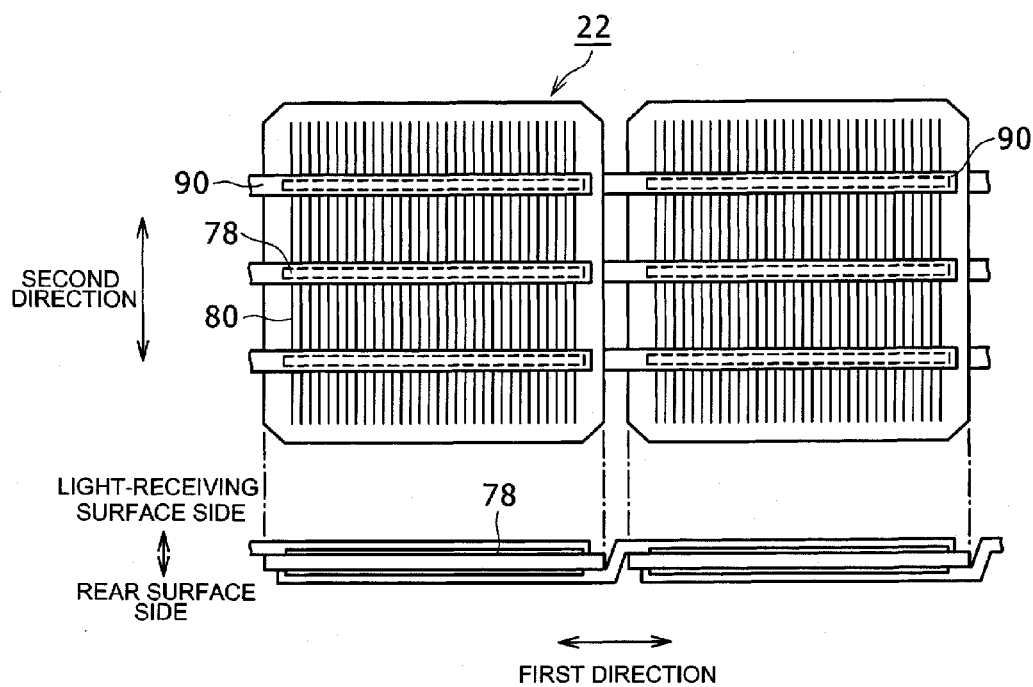
FIG. 4 is a diagram showing a part of a solar cell string according to the embodiment of the present invention.

More specifically, as shown in FIG. 4, solar cells 22, each having collector electrodes 78 (which serve as connecting electrodes) and thin-line electrodes 80 on a light-receiving surface and a rear surface, are arranged such that the extending direction of the collector electrodes 78 is along the first direction. Further, in adjacent solar cells 22, a wiring member 90 is connected, by means of an adhesive (not shown), to a collector electrode 78 on the light-receiving surface of a first one of the adjacent solar cells 22 and to a collector electrode 78 on the rear surface of a second one of the adjacent solar cells 22. Using this structure, a predetermined number of solar cells 22 are connected together in series. To the collector electrodes 78 which belong to the solar cells 22 located at two ends of the array of the connected predetermined number of solar cells 22 and which are not connected with the wiring members 90, wiring members 92 which will serve as connecting portions for the solar cell string are connected by means of an adhesive (not shown). Each of the solar cell strings 24~29 is configured in this way. In the present embodiment, three collector electrodes 78 are provided on the light-receiving surface and on the rear surface in each solar cell 22, and the wiring members 90, 92 are connected to the respective ones of those collector electrodes 78.

Each solar cell 22 of the present embodiment is configured by laminating an i-type amorphous silicon layer and a p-type amorphous silicon layer on a light-receiving surface of a substrate, further laminating an i-type amorphous silicon layer and an n-type amorphous silicon layer on a rear surface of the substrate, and providing a p-i-n junction as the structure of a photoelectric conversion section. Further, a transparent conductive film (TCO), the collector electrodes 78, and the thin-line electrodes are laminated on the p-type amorphous silicon layer and the n-type amorphous silicon layer, thereby forming a double-side generation type solar cell 22.

As the wiring members 90, 92, a thin plate composed of a metal conductive material such as copper is used. Instead of a thin plate, the material used may alternatively be in the form of a stranded wire. Other than copper, silver, aluminum, nickel, tin, gold, or an alloy thereof may be used as the metal conductive material.

The adhesive may be a conductive solder, or alternatively, a thermosetting resin adhesive such as an acrylic-based adhesive, a highly-flexible polyurethane-based adhesive, or an epoxy-based adhesive. In the case of using a thermosetting resin adhesive, the adhesive may contain conductive particles made of nickel, silver, gold-coated nickel, tin-plated copper, or the like. When an insulating resin adhesive is used as the adhesive, one or both of the surfaces opposite each other of the wiring members 90, 92 and the collector electrodes 78 are preferably provided with unevenness features.

Figure 5:
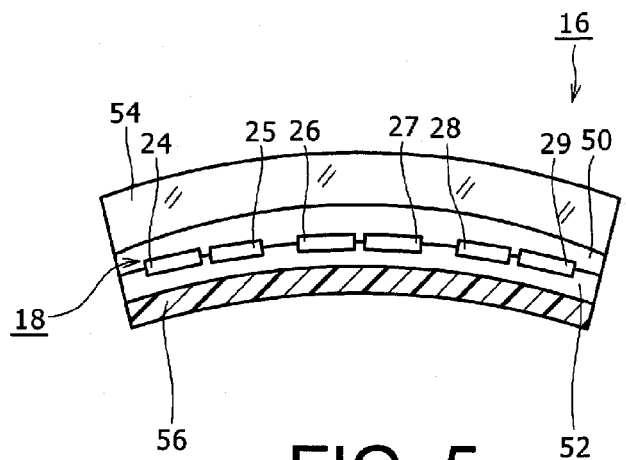
FIG. 5 is a cross-sectional view taken along cross-section A-A of the solar cell module according to the embodiment of the present invention.

Next, a laminated structure of the solar cell module 16 is described with reference to FIG. 5. FIG. 5 is a cross-sectional view taken along line A-A which extends along the direction intersecting the first direction in FIG. 3. The solar cell module is configured by sequentially laminating, from the light-receiving surface side, a first protective member 54, a first filler 50, the connected solar cell unit 18, a second filler 52, and a second protective member 56.

The first protective member 54 has such functions as to prevent ingress of contaminants, foreign substances, moisture, and the like, and is implemented with a plate or structure having a three-dimensional curved surface shape. In the present embodiment, since the first protective member 54 is positioned on the light-receiving surface side of the connected solar cell unit 18, a translucent member such as a glass plate or a resin plate can be used as the first protective member 54. Specifically, in the present embodiment, the first protective member 54 is implemented with a glass plate having a curved surface shape conforming to an outer shape of the roof part of the vehicle body 12 of the vehicle 10, and having a convex shape projecting toward the light-receiving surface side.

The second protective member 56 may be implemented with a plate or film having such functions as to prevent ingress of contaminants, foreign substances, moisture, and the like. For example, it is possible to use a laminated film such as a resin film containing an aluminum foil therein.

The first filler 50 has the function of a shock absorber as well as such functions as to prevent ingress of contaminants, foreign substances, moisture, and the like, and is a sheet material configured in a layer form. A material for the first filler 50 is selected in consideration of such aspects as heat resistance, adhesiveness, flexibility, formability, and durability. As the first filler 50 introduces light from the outside, a transparent filler that has maximum possible colorless transparency and that is capable of transmitting incident light without absorbing or reflecting is employed. For example, polyethylene-based olefin resin, ethylene vinyl acetate (EVA), or the like is used. Other than EVA, EEA, PVB, silicone-based resin, urethane-based resin, acrylic-based resin, epoxy-based resin, or the like may also be used.

Similar to the first filler 50, a material for the second filler 52 is selected in consideration of such aspects as heat resistance, adhesiveness, flexibility, formability, and durability. As the second filler 52, polyethylene-based olefin resin, ethylene vinyl acetate (EVA), or the like is used. Other than EVA, EEA, PVB, silicone-based resin, urethane-based resin, acrylic-based resin, epoxy-based resin, or the like may also be used. Depending on the specifications of the solar cell module 16, the second filler 52 may be implemented with a transparent filler, so as to transmit incident light and allow the light to be reflected by the second protective member 56, whereby power generation efficiency can be increased. Alternatively, the second filler 52 may be implemented with a colored filler, which may have a similar color as the solar cells so that design impression can be enhanced, or which may be colored white so that incident light can be reflected and power generation efficiency can be increased. When the second filler 52 having a white color is to be used, it is possible to employ a material obtained by adding, to the above-described filler having colorless transparency, an inorganic pigment such as tin oxide or zinc oxide as an additive for attaining the white color.

While in the present embodiment the first protective member corresponds to the protective member on the light-receiving surface side and the second protective member corresponds to the protective member on the rear surface side, this is because the above description was made assuming that the protective member on the light-receiving surface side has the curved surface. The present invention is not limited to this structure, and may alternatively relate to a structure in which the protective member on the rear surface side has the curved surface. In that case, the first protective member would correspond to the protective member on the rear surface side, and the second protective member would correspond to the protective member on the light-receiving surface side. Accordingly, the second protective member would be implemented with a translucent member such as a glass plate or a resin plate.

While in the present embodiment the first protective member corresponds to the protective member on the light-receiving surface side and the second protective member corresponds to the protective member on the rear surface side, this is because the above description was made assuming that the protective member on the light-receiving surface side has the curved surface. The present invention is not limited to this structure, and may alternatively relate to a structure in which the protective member on the rear surface side has the curved surface. In that case, the first protective member would correspond to the protective member on the rear surface side, and the second protective member would correspond to the protective member on the light-receiving surface side. Accordingly, the second protective member would be implemented with a translucent member such as a glass plate or a resin plate.

While in the present embodiment the curved surface of the first protective member has a convex shape projecting toward the outer side, the first protective member may alternatively have a curved surface that recesses toward the inner side. Further, while the structure of the photoelectric conversion section was described above as a p-i-n junction, it is acceptable so long as the structure is a p-n junction in a broad sense. Furthermore, the structure is not limited to a hetero-type formed by laminating layers, but may alternatively be formed by dispersing a dopant. Moreover, in the present embodiment while the solar cells 22 are of a double-side generation type, the present invention is not limited in this regard, and the solar cells 22 may alternatively be of a one-side generation type in which a metal film such as an aluminum film is provided on the rear surface side over substantially the entire surface. Further, the present invention is not limited to using solar cells in which the collector electrodes and the thin-line electrodes are formed on the light-receiving surface and the rear surface, but may alternatively use solar cells of a back junction type in which the collector electrodes and the thin-line electrodes are formed only on the rear surface. Here, in cases in which solar cells of a back junction type are used as the solar cells 22, the solar cell strings would be appropriately modified and formed by, for example, arranging the solar cells such that their sides having the collector electrodes are adjacent to each other.

Figure 6:
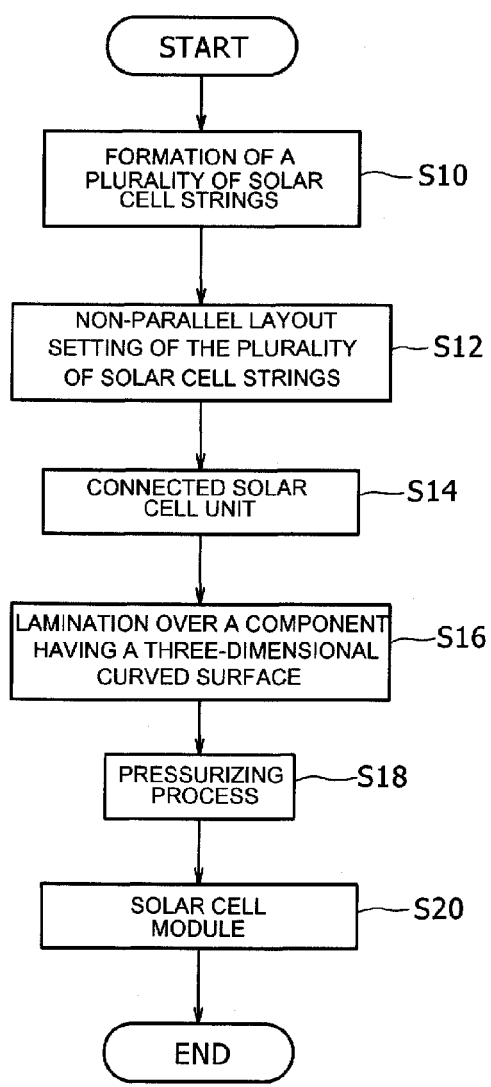
FIG. 6 is a flowchart showing a procedure for producing the solar cell module according to the embodiment of the present invention.

Next, a procedure for producing the solar cell module 16 having the above-described structure is described. FIG. 6 is a flowchart showing the procedure for producing the solar cell module 16.

To start with, formation of each solar cell string is explained. First, there are provided a plurality of solar cells 22 each having collector electrodes 78 and thin-line electrodes on its light-receiving surface and rear surface. A predetermined number of solar cells 22 are arranged such that the extending direction of the collector electrodes 78 is along the first direction. Subsequently, in adjacent solar cells 22, a wiring member 90 is connected, by means of an adhesive, to a collector electrode 78 on the light-receiving surface side of a first one of the adjacent solar cells 22 and a collector electrode 78 on the rear surface side of a second one of the adjacent solar cells 22. To the collector electrodes 78 which belong to the solar cells 22 located at two ends of the array of the connected predetermined number of solar cells 22 and which are not connected with the wiring members 90, wiring members 92 which will serve as connecting portions for the solar cell string are connected by means of an adhesive, and each of the solar cell strings is thereby formed (S10 in FIG. 6).

Figure 7:
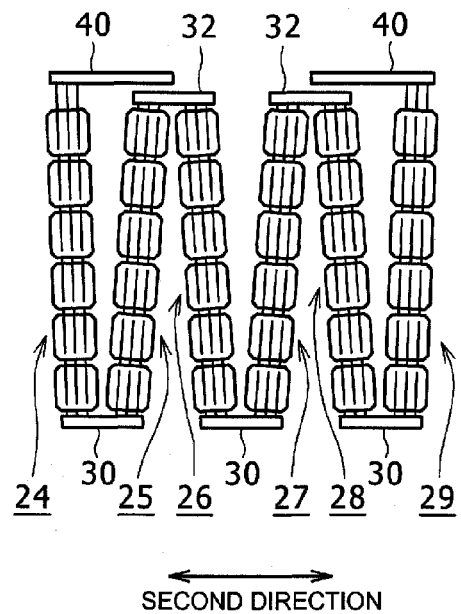
FIG. 7 is a top view of a connected solar cell unit according to the embodiment of the present invention.

Next, formation of the connected solar cell unit 18 is explained. First, six solar cell strings are temporarily laid out so as to be arranged along the second direction while the first directions of the solar cell strings are matched with each other, and are also arranged such that, at a same end side of adjacent solar cell strings, wiring members 92 outputting electric power in opposite polarities are located adjacent to each other. Subsequently, the six solar cell strings are set to a predetermined position for forming the connected solar cell unit 18, and then connected together. In the following, a specific process of the layout setting and the connection between respective components is described with reference to FIG. 7 while assuming, for convenience of explanation, that the solar cell strings 24-29 have been arranged in order along the second direction.

The solar cell strings 24, 25 are set such that the interval between the solar cell strings is progressively wider from the one end side toward the other end side, and such that the first directions of the solar cell strings are non-parallel to each other. Subsequently, the wiring members 92 of the solar cell strings 24, 25 located on the one end side are connected to each other in series using a connection member 30. In other words, the layout setting is performed such that angles formed between the connection member 30 and the respective solar cell strings become obtuse angles, and the connection is made. Similarly, regarding the pair of solar cell strings 26, 27 and the pair of solar cell strings 28, 29, each pair is set such that the interval between the solar cell strings is progressively wider from the one end side toward the other end side and such that the first directions of the solar cell strings are non-parallel to each other, and then the wiring members 92 of the solar cell strings located on the one end side are connected to each other in series using a connection member 30 (S12 in FIG. 6).

Simultaneously, the solar cell strings 25, 26 are set such that the interval between the solar cell strings is progressively wider from the other end side toward the one end side, and such that the first directions of the solar cell strings are non-parallel to each other. Subsequently, the wiring members 92 of the solar cell strings 25, 26 located on the other end side are connected to each other in series using a connection member 32. In other words, the layout setting is performed such that angles formed between the connection member 32 and the respective solar cell strings become obtuse angles, and the connection is made. Similarly, the solar cell strings 27, 28 are set such that the interval between the solar cell strings is progressively wider from the other end side toward the one end side and such that the first directions of the solar cell strings are non-parallel to each other, and then the wiring members 92 of the solar cell strings located on the other end side are connected to each other in series using a connection member 32 (S12 in FIG. 6).

As a result, the solar cell strings 24-29 are arranged and connected by the connection members 30, 32 in a zigzag form. In other words, the intervals between adjacent solar cells at the one end side are such that a pattern comprising a tight interval followed by a loose interval is repeated in order from the side of the solar cell string 24, while the intervals at the other end side are such that a pattern comprising a loose interval followed by a tight interval is repeated in order from the side of the solar cell string 24. Here, the intervals between the solar cell strings are determined in accordance with the curvature of the first protective member 54 having the three-dimensional curved surface.

Further, among the solar cell strings 24-29 connected by the connection members 30, 32, in the solar cell strings 24, 29 located at the two edges in the second direction, output members 40 are connected to the wiring members 92 at the other end side, and the connected solar cell unit 18 is thereby formed (S14 in FIG. 6).

Figure 8:
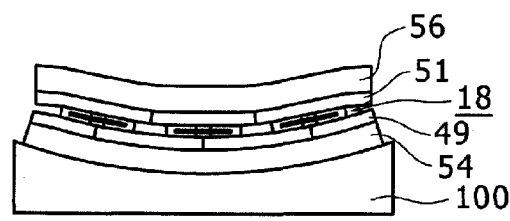
FIG. 8 is a diagram showing a procedure for arranging components in a solar cell module production method according to an embodiment of the present invention.

Next, on top of a first protective member 54, a first resin sheet 49, the connected solar cell unit 18, a second resin sheet 51, and a second protective member 56 are sequentially laminated and arranged. The following description is given with reference to FIG. 8 while assuming that the laminating process is performed on a base 100 (S16 of FIG. 6).

Figure 9:
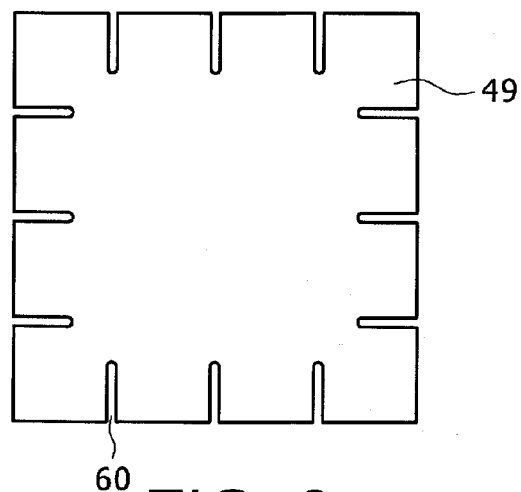
FIG. 9 is a top view of a first resin sheet used in the solar cell module production method according to the embodiment of the present invention.

First, the first resin sheet 49 is laminated on the first protective member 54. The first resin sheet 49 is a flexible sheet member which will serve as the first filler 50 after being subjected to a pressure bonding and heating process described later. When placing the first resin sheet 49 on the first protective member 54 having a three-dimensional curved surface, it is preferable to form, in the outer edges of the first resin sheet 49, a plurality of cuts 60 extending from the edge portions toward the center portion, as shown in FIG. 9. In FIG. 9, in accordance with the planar shape of the connected solar cell unit 18 being rectangular, the planar shape of the first resin sheet 49 is rectangular. In the opposite sides of this rectangle, identical numbers of cuts 60 are formed in line symmetry with each other.

The cuts are provided at substantially uniform intervals. In one example, the length of the cuts is approximately $\frac{1}{10}$ to $\frac{1}{6}$ of the length of a side of the first resin sheet 49. The shape of the cuts may be a slit shape, or alternatively, a wedge shape or the like.

According to the above arrangement, when the first resin sheet 49 is placed on the first protective member 54, by means of the cuts 60, the first resin sheet 49 can be arranged in a curved manner substantially conforming to the curved surface on the rear surface side of the first protective member 54.

On top of the first resin sheet 49, the connected solar cell unit 18 is arranged. The connected solar cell unit 18 is configured such that, on a flat plate, the plurality of solar cell strings extending in the first direction are arranged and connected while being non-parallel to each other. By means of this configuration, when the connected solar cell unit 18 is placed on the first resin sheet 49 which has been deformed in accordance with the curved surface of the first protective member 54, adjacent solar cell strings can be arranged without overlapping each other.

On top of the connected solar cell unit 18, the second resin sheet 51 is arranged. The second resin sheet 51 is a flexible sheet member which will serve as the second filler 52 after being subjected to a pressurizing process described later.

As with the first resin sheet 49, when placing the second resin sheet 51 over the first protective member 54 having the three-dimensional curved surface, it is preferable to form, in the outer edges of the second resin sheet 51, a plurality of cuts extending from the edge portions toward the center portion. As to the method of forming the cuts in the second resin sheet 51, those cuts can be formed in a similar manner as in the first resin sheet 49.

Additionally, in forming the cuts in the second resin sheet 51, in order to prevent degradation of visual impression due to generation of creases or the like in the solar cell module having a curved surface, a colored second resin sheet 51 is preferably used so that the creases or the like would be less noticeable. Next, the second protective member 56 is arranged on top of the second resin sheet 51.

The structure obtained on the base 100 by sequentially laminating the first protective member 54, the first resin sheet 49, the connected solar cell unit 18, the second resin sheet 51, and the second protective member 56 is then pressurized from the side of the second protective member 56 using an elastic body 130 (S18 in FIG. 6). As the elastic body 130, an airtight rubber sheet or the like can be used. By means of this process, air between the first protective member 54, the first resin sheet 49, the connected solar cell unit 18, the second resin sheet 51, and the second protective member 56 can be purged, and the respective components can be adhered closely. A heating process may be performed after the pressurizing process or simultaneously with the pressurizing process, as necessary.

As a result of the above, the first resin sheet 49 and the second resin sheet 51 are configured into the first filler 50 and the second filler 52, and the first protective member 54, the first filler 50, the connected solar cell unit 18, the second filler 52, and the second protective member 56 are integrated into one unit, such that a completed solar cell module 16 is obtained (S20 in FIG. 6).

By using the connected solar cell unit 18 in which the plurality of solar cell strings extending in the first direction are arranged non-parallel to each other as described above, it is possible to favorably prevent overlapping of adjacent solar cell strings and thereby minimize cracking of the solar cells. Furthermore, by having the solar cell strings arranged at substantially uniform intervals in the completed solar cell module 16, design impression can be enhanced.

The above description of the embodiment refers to a solar cell module embedded in a concave portion provided on a roof part of a vehicle body of a vehicle. However, the location in which the solar cell module is embedded may be other than a roof part, and may be an engine hood part, a trunk part, or a door part of a vehicle, for example.

Materials, thicknesses, dimensions, numbers of solar cell modules, and the like mentioned in the above description of the embodiment are simply examples for illustrative purposes, and may be modified as appropriate depending on the specifications of the solar cell module.

INDUSTRIAL APPLICABILITY

The present invention is applicable to production of a solar cell module having a curved surface.

LIST OF REFERENCE SYMBOLS 10 vehicle; 12 vehicle body; 16 solar cell module; 18 connected solar cell unit; 22 solar cell; 24, 25, 26, 27, 28, 29 solar cell string; 30, 32 connection member; 40 output member; 49 first resin sheet; 50 first filler; 51 second resin sheet; 52 second filler; 54 first protective member; 56 second protective member; 78 collector electrode; 80 thin-line electrode; 90, 92 wiring member; 100 base; 130 elastic body.

The invention claimed is:

1. A solar cell module production method, comprising:
   forming a plurality of solar cell strings in each of which a predetermined number of solar cells are connected in series;
   arranging the plurality of solar cell strings along a second direction intersecting a first direction in which the solar cell strings extend, and also arranging the solar cell strings such that an interval between adjacent (N−1)th and Nth solar cell strings at one end in the first direction is smaller than an interval at the other end;

connecting the arranged plurality of solar cell strings to each other to thereby form a connected solar cell unit;

laminating a first filler sheet, the connected solar cell unit, a second filler sheet, and a second protective member, in that order, on a first protective member having a three-dimensional curved surface; and applying pressure from above the second protective member and thereby forming a solar cell module having a curved surface shape.

2. The solar cell module production method according to claim 1, wherein in the connected solar cell unit, adjacent (N−1)th, Nth, and (N+1)th solar cell strings are arranged such that, at the one end in the first direction, the interval between the Nth and the (N+1)th solar cell strings is larger than the interval between the (N−1)th and the Nth solar cell strings, and, at the other end in the first direction, the interval between the Nth and the (N+1)th solar cell strings is smaller than the interval between the (N−1)th and the Nth solar cell strings.

3. The solar cell module production method according to claim 1, wherein the connected solar cell unit is configured by electrically connecting between adjacent (N−1)th and Nth solar cell strings at the one end in the first direction.

4. The solar cell module production method according to claim 2, wherein the connected solar cell unit is configured by electrically connecting between adjacent Nth and (N+1)th solar cell strings at the other end in the first direction.

5. The solar cell module production method according to claim 1, wherein of the first filler sheet and the second filler sheet, that filler sheet that serves as a rear surface side filler sheet is a colored filler sheet.

6. The solar cell module production method according to claim 1, wherein at least one of the first filler sheet and the second filler sheet has, in an outer edge thereof, a plurality of cuts extending from an edge portion toward a center portion.

* * * * *